United States Patent [19]

Feldmann et al.

[11] Patent Number: 4,459,569
[45] Date of Patent: Jul. 10, 1984

[54] RECURSIVE FILTERS WITH A COMMON CHANNEL CHARGE TRANSFER DEVICE

[76] Inventors: Michel Feldmann, 45 rue Saint Lambert, F-75015 Paris; Jeannine Le Goff épouse Hénaff, 3 ter Place Marquis, F-92140 Clamart, both of France

[21] Appl. No.: 380,039

[22] Filed: May 20, 1982

[30] Foreign Application Priority Data

May 27, 1981 [FR] France .................. 81 10945

[51] Int. Cl.$^3$ .................. H03H 15/02; G11C 19/28
[52] U.S. Cl. .................. 333/165; 333/166; 377/61; 377/76; 357/30
[58] Field of Search .................. 333/165–167; 357/24, 30; 377/57, 60–63, 76, 77; 328/167

[56] References Cited

U.S. PATENT DOCUMENTS 4,245,199 1/1981 Suciu .................. 333/165
4,292,609 9/1981 Feldman et al. .................. 333/165

OTHER PUBLICATIONS

Reference Data for Radio Engineers, 5th Ed., Published 1968, by ITT, Howard Sams and Co. Division; pp. 4–25.

Primary Examiner—Marvin L. Nussbaum
Attorney, Agent, or Firm—Laff, Whitesel, Conte & Saret

[57] ABSTRACT

A common channel charge transfer recursive filter has two delay lines, in which charges are transferred in opposite directions. Exchange bridges having two sections extend between the lines. Each section feeds a predetermined charge fraction to one of the two downstream electrodes with charges flowing from the two upstream electrodes. The charge transfer is controlled by a three-phase system ($\phi1$, $\phi2$, $\phi3$). Split memory electrodes and the exchange bridges are connected to the first phase ($\phi1$) bus. A transfer electrode is in each gap between an exchange bridge and a memory electrode and is connected to the second phase ($\phi2$) bus. A second transfer electrode is connected to the third phase ($\phi3$) bus. The gap between a memory electrode and the next exchange bridge is occupied by a transfer electrode connected to the second phase ($\phi2$) bus and by a transfer electrode connected to the third phase ($\phi3$) bus.

5 Claims, 9 Drawing Figures

RECURSIVE FILTERS WITH A COMMON CHANNEL CHARGE TRANSFER DEVICE

The present invention relates to recursive filters with a common channel charge transfer device (CTD) comprising two reverse transmission lines with bridges between the lines, the exchange bridges being longitudinally split in the direction of the channel between the CTD adjacent lines.

By way of illustration, reference will be made to the U.S. Pat. No. 4,292,609. In the patent, a CTD recursive filter is comprised of two side-by-side delay lines in the same channel, with the charges being transferred in opposite directions in the lines, respectively. Each electrode of the first delay line forms a pair with a corresponding electrode of the second delay line. Each even pair of electrodes is separated from the next odd pair of electrodes by an even bridge electrode occupying the entire width of the channel. Each odd pair of electrodes is separated from the next even pair of electrodes by an odd bridge electrode occupying the entire width of the channel. An electrode of the first line in an even pair and the electrode of the second line in the next odd pair are such that the sum of their lengths is a constant when the even pair is separated from the odd pair by an even bridge electrode. An electrode of the first line in an odd pair and the electrode of the second line in the next even pair are such that the sum of their lengths is equal to the constant when the odd pair is separated from the even pair by an odd bridge electrode. For each clock pulse of an odd phase, the charges of an odd bridge electrode are distributed to the closer even bridge electrodes in proportion to the lengths of the electrode of the first line in the adjacent even pair and the electrode of the second line in the adjacent odd pair. For each clock pulse of even phase, the charges of an even bridge electrode are distributed to the closer odd bridge electrodes in proportion to the lengths of the electrode of the first line in the adjacent odd pair and the electrode of the second line in the adjacent even pair. At least, one of the delay lines is coupled to an input to which the signal to be filtered is applied and to an output for delivering filtered signals.

U.S. Pat. No. 4,292,609 describes a recursive filter of the type defined in the above first paragraph. More particularly, this patent has a filter wherein an exchange bridge electrode may be separated in two sections. Each section enables a transfer of predetermined fractions of charges from the two upstream electrodes to one of the two downstream electrodes. A two-section exchange bridge electrode is obtained by providing an S-shaped barrier in said electrode. Each end of the S-shaped barrier abuts in front of the output edge of the associated upstream electrode, on a predetermined point along the output edge.

An object of the present invention is to provide CTD recursive filters with a three-phase operation, thus making it possible to utilize the materials III–V as semiconductors. (These materials are identified on pages 4–25 of "*Reference Data For Radio Engineers*", 5th Ed., published 1968 by ITT, Howard Sams & Co. Division).

According to a feature of the present invention, a recursive filter is provided with a charge transfer device, wherein the charge transfer is controlled by a three-phase system, the split memory electrodes and the exchange bridges being connected to a bus energized by the first phase. Each gap between an exchange bridge and a memory electrode is occupied by a transfer electrode energized by the third phase. The gap between a memory electrode and the next exchange bridge is occupied by a transfer electrode connected to a bus energized by the second phase and by a transfer electrode connected to a bus energized by the third phase. The outer parts of the memory electrodes are connected to an input of a differential amplifier. The inner parts of the electrodes are connected to the other input of said differential amplifier, at the output of which the filtered output signal is delivered.

According to another feature, a filter is provided wherein the parts of a memory electrode are not connected to the differential amplifier between two exchange bridges alternatively in one of the two lines.

According to another feature, the outer parts of the memory electrodes which are connected to the differential amplifier are alternatively connected, in each line, either to one or the other input of the amplifier, the inner parts of the electrodes being merely connected to the corresponding phase bus.

According to another feature, the semiconductor substrate of the CTD device is transparent. The input structure of the filter comprises a Schottky diode of which the region $n^-$ is in contact with the substrate and extends in parallel with the electrodes of the CTD device in the lower (or upper) part of the channel. The region $p^+$ has a contact connected to one terminal of a source of potential. The other terminal of the source is connected to a contact under the semiconductor substrate. The end of an optical fiber is directed to the region $n^-$ of the Schottky diode, through the transparent semiconductor substrate, and the input signal to be filtered is transmitted through said optical fiber.

According to another feature, the contact of the region $p^+$ of the Schottky diode is formed by a transparent electrode and the optical fiber is directly oriented towards the electrode.

The above features of the present invention and others will appear more clearly from the following description of embodiments, the description being made in conjunction with the accompanying drawings, wherein.

In particular and with reference to FIGS. 11 and 14 of U.S. Pat. No. 4,292,609, various embodiments of the recursive filters were described in which the structure is illustrated by the example shown in FIG. 1 of the present application.

Figure 1:
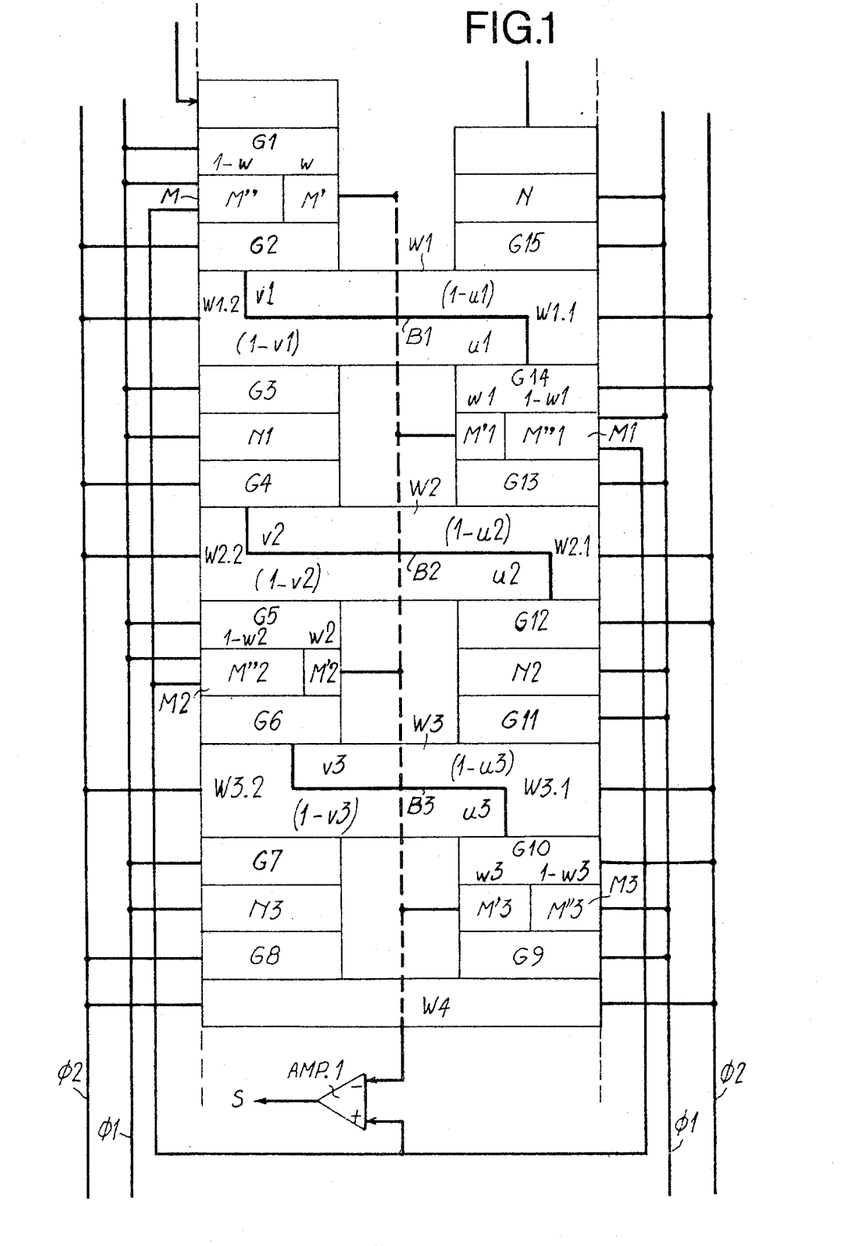
FIG. 1 is a schematic illustration of a two-phase charge transfer device in a well-known recursive filter.

The charge transfer device of FIG. 1 is provided with a single channel delimited by two parallel broken lines. The channel is comprised of an upper part (the right-hand part of FIG. 1), a middle part and a lower part. In the lower part (the left-hand part of FIG. 1), split electrodes G1-G8 are provided with a memory electrode M between electrodes G1 and G2, a memory electrode N1 between electrodes G3 and G4, a memory electrode M2 between electrodes G5 and G6, and a memory electrode N3 between electrodes G7 and G8. In the upper part (right-hand side of FIG. 1), split electrodes G9-G15 are provided, with a memory electrode M3 between electrodes G9 and G10, a memory electrode N2 between electrodes G11 and G12 and a memory electrode M1 between electrodes G13 and G14. The electrodes G2 and G15 are transversally aligned with respect to the longitudinal direction of the channel, and also transversally aligned are electrodes G3 and G14, G4 and G13, G5 and G12, G6 and G11, G7 and G10, and G8 and G9. A bridge electrode W1 is provided on the side of electrodes G8-G9 opposite to memory electrodes N3-M3. A memory electrode N is provided on the side of electrode G15 opposite to W1.

The bridge W1 is split into two bridge sections W1.1 and W1.2 by a barrier that cannot be crossed by the charges. Such a barrier may be formed in a conventional manner, as by providing a convenient implantation along the line B1. Likewise, the bridge W2 is split into two sections W2.1 and W2.2, and the bridge W3 is split into two sections W3.1 and W3.2. On the contrary, bridge W4 is a simple and unsplit bridge electrode.

A length v1 of the section W1.1 is adjacent to the electrode G2; a length (1-u1) of section W1.1 is adjacent to the electrode G14, and a length of unit value is adjacent to the electrode G15. The section W1.2 has a length (1-v1) adjacent to the electrode G2, a length u1 adjacent to the electrode G14, and a length of unit value adjacent to the electrode G3. The sections of bridges W2 and W3 have the same structure, the lengths corresponding to the above-mentioned lengths for the sections of bridge W1 being marked v2, (1-u2), 1, (1-v2), u2, 1 and v3, (1-u3), 1, (1-v3), u3, 1. It will be noted that all the split and memory electrodes are assumed to have a length of unit value in this example.

The electrodes G1, M, G3, N1, G5, M2, G7, N3, G9, M3, G11, N2, G13, M1, G15 and N are connected to the phase bus $\phi 1$ whereas the electrodes G2, G4, G6, G8, G10, G12, G14, W1, W2, W3 and W4 are connected to the phase bus $\phi 2$.

To describe the operation of the device of FIG. 1, it is assumed that the charges are trapped under the memory electrodes, M, N, M1 to M3, and N1 to N3 before the working potential is applied to the bus $\phi 2$. When the bus $\phi 2$ is turned on, the charges under memory electrode M flow in proportion to length v1 into the section W1, and in proportion to length (1-v1) into the section W1.2; the charges under electrode N1 flow in proportion to length v1 into the section W2.1, and in proportion to length (1-v2) into the section W2.2; the charges under electrode M2 flow in proportion to length v3 into the section W3.1 and in proportion to length (1-v3) into the section W3.2; the charges of memory N3 flow into bridge W4; the charges of memory M3 flow in proportion to length (1-u3) into the section W3.1, and in proportion to length u3 into the section W3.2; the charges of memory N2 flow in proportion to length (1-u2) into the section W2.1, and in proportion to length u2 into the section W2.2; the charges of memory M1 flow in proportion to length (1-u1) into the section W1.1, and in proportion to length u1 into the section W1.2 and the charges under memory N leave the device.

Therefore, at the end of the phase time $\phi 2$, the charge trapped in the section W1.1 is v1 times as big as the charge X previously trapped under memory M, plus (1-u1)X1, X1 being the charge previously trapped under M1, etc.

When the bus $\phi 1$ is turned on, the charges flow from the bridge section W1. to memory N, through electrode G15; from W1.2 to N1, through G3; from W2 to N1, through G13; from W2.2 to M2, through G5; from W3.1 to N2, through G11; from W3.2 to N3, through G7; and from W4 to M3, through G9.

In addition, the memory electrodes of the device of FIG. 1 are split electrodes. The electrode M is thus divided into electrodes M' and M", the electrode M1 into M'1 and M"1; the electrode M2 into M'2 and M"2; and the electrode into M'3 and M"3.

The memory electrode components M', M'1, M'2 and M'3 are connected in parallel to the input + of a differential amplifier AMP1, whereas the memory electrode components M", M"1, M"2 and M"3 are connected in parallel to the input − of said differential amplifier. The filter output signal S is delivered from the output of the differential amplifier AMP1. Such an arrangement is similar to the conventional circuit utilized in non-recursive CTD filters with split electrodes, but, in the present case, it is utilized in a recursive filter.

Obviously, the relative lengths of electrodes M' and M", M'1 and M"1, ..., M'2 and M"3 (which are subsequently indicated by w, (1-w), w1, (1-w1), ..., w3, (1-w3)) are variable from one unit to the other.

As described in U.S. Pat. No. 4,292,609, the structure with split bridge electrodes defines the denominator Q(z) of the transfer function (in z-transform) of the filter. The split memory electrodes associated with the differential amplifier define the numerator P(z) of said function which may be stated as follows:

$$S = \frac{P(z)}{Q(z)}$$

In the above-mentioned recursive filters of U.S. Pat. No. 4,292,609, the charge transfer device structures operate with two phases. Such a two-phase system entails a degree of technology skill which is attained only if silicon is utilized as a semiconductor. Now, other semiconductor materials, such as the materials III-V are also attractive for widening the frequency range of these types of filters and for allowing their application in video-communications and optical communications.

Figure 2:
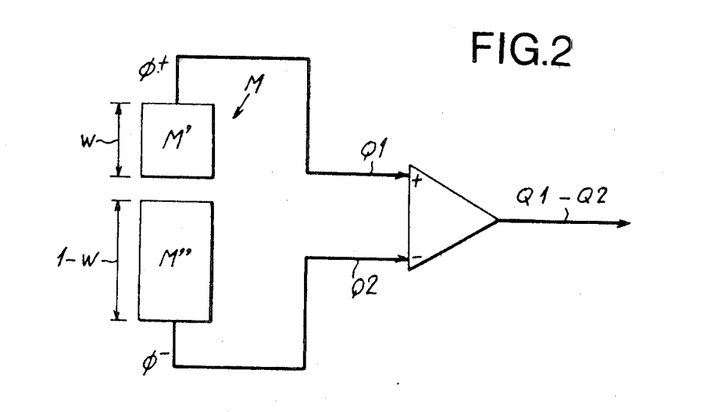
FIGS. 2 and 3 are schematic diagrams illustrating one aspect of the operation of the filter of FIG. 1.

On the other hand, as clearly shown in FIG. 2 for the electrode M of FIG. 1 for obtaining a fraction r of the charge Q of the electrode M with −1 r 1, the area S of the electrode must be divided into an area $S(1+r)/2 = Sw$ for M' and an area $S(1-r)/2 = S(1-w)$ for M", whereby the following is obtained on the terminal + of the amplifier AMP1:

$$Q1 = Q \frac{1+r}{2}$$

$$Q2 = Q \frac{1-r}{2}$$

$$Q1 - Q2 = rQ$$

Figure 3:
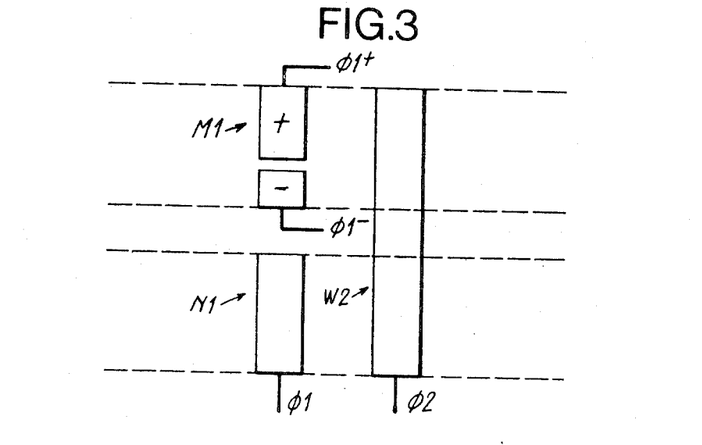

As clearly shown in FIG. 3, each split memory electrode must be connected to two connecting busses $\phi 1+$ and $\phi 1-$. In addition, the bridge electrodes are connected to the bus $\phi 1$, for example. As a result, the bus implantation between the two channels involves a two-level technology. It is difficult to make the levels $\phi1+$ and $\phi1-$ identical and yet it is necessary, so that the difference $Q1-Q2$ may be exactly performed.

On the other hand, the different noise sources are proportional to the area S of the electrodes connected to the amplifier. On the contrary, the signal is proportional to the difference of the split electrodes. For example, if the difference is nil (r=0), the signal is nil, but the noise is important. Such an arrangement leads therefore to a bad signal-to-noise ratio, especially in the case where there are many factors of small value. To conclude, such an arrangement limits the final dynamic characteristic of the filter.

Figure 4:
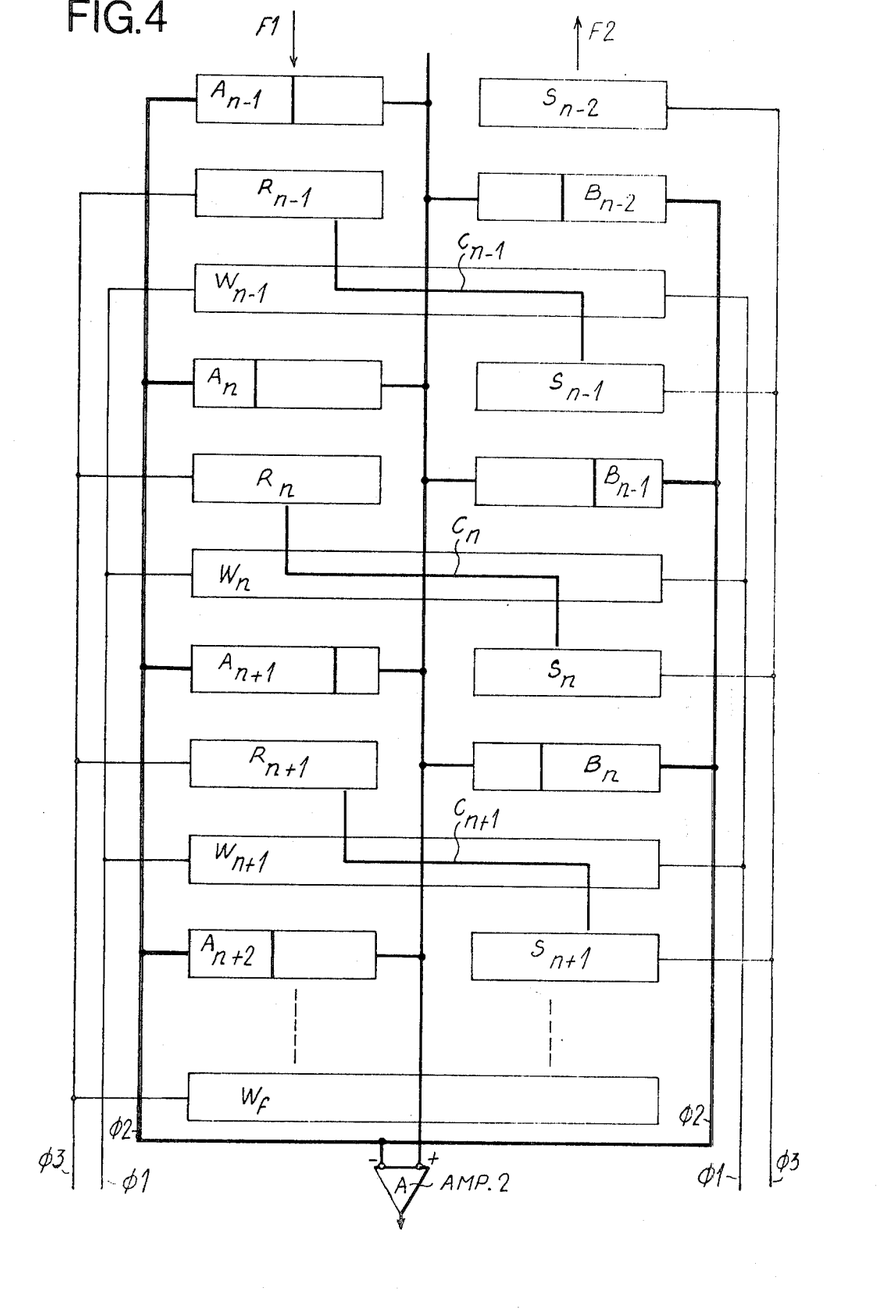
FIG. 4 is a schematic illustration of a three-phase charge transfer device for a recursive filter according to the invention.

The charge transfer device of FIG. 4 comprises a single channel delimited by two broken lines. The channel has an upper part, a middle part and a lower part. In the lower part, are split electrodes . . . , $A_{n-1}, A_n, A_{n+1}, A_{n+2}, \ldots$ with a memory electrodes $R_{n-1}$ and a bridge electrode $W_{n-1}$ between electrodes $A_{n-1}$ and $A_n$, and so on. In the upper part, are split electrodes . . . , $B_n, B_{n-1}, B_{n-2}, \ldots$ with a memory electrode $S_n$ and a bridge electrode $W_n$ between the electrodes $B_n$ and $B_{n-1}$, and so on.

The electrodes $A_x$ and $R_x$ are only in the lower part of the channel, and the electrodes $B_x$ and $S_x$ are only in the upper part, but the bridge electrodes $W_x$ extend over the entire width of the channel, including the middle part.

The bridge electrodes $W_x$ are connected to the phase bus $\phi1$, the electrodes $A_x$ and $B_x$ are connected to the phase bus $\phi2$, and the electrodes $R_x$ and $S_x$ are connected to the phase bus $\phi3$.

The electrodes $W_x$ are divided into two bridge sections $W1_x$ and $W2_x$ by a barrier $C_x$ which cannot be crossed by the charges. This barrier may be manufactured according to well-known methods, as indicated in U.S. Pat. No. 4,292,609. The memory electrodes $R_x$ and $S_x$ extend over their entire respective channel part. The split electrodes $A_x$ and $B_x$ are divided into two parts $A1_x$, $A2_x$ and $B1_x$, $B2_x$. The split electrode parts $A1_x$ and $B1_x$ are connected to the input $-$ of a differential amplifier AMP2, whereas the split electrode parts $A2_x$ and $B2_x$ are connected to the input $+$ of the amplifier, the parts being adjacent to the middle part of the channel.

The phases are switched according to the following sequence: $\phi1$, $\phi2$, $\phi3$. It will be also noted that the charges flow in the direction of the arrow F1 in the lower part, and in the direction of the arrow F2 which is opposite to that of the arrow F1 in the upper part. For example, the charges are introduced into one end of the lower part of the channel wherefrom they flow in the direction of F1. The charges are extracted from the end adjacent to the upper part of the channel after they have been flowing in the direction of F2, the transfer between the lower and upper parts being made through the bridge electrodes as well as through a non-split reflective bridge electrode $W_f$.

Figure 5:
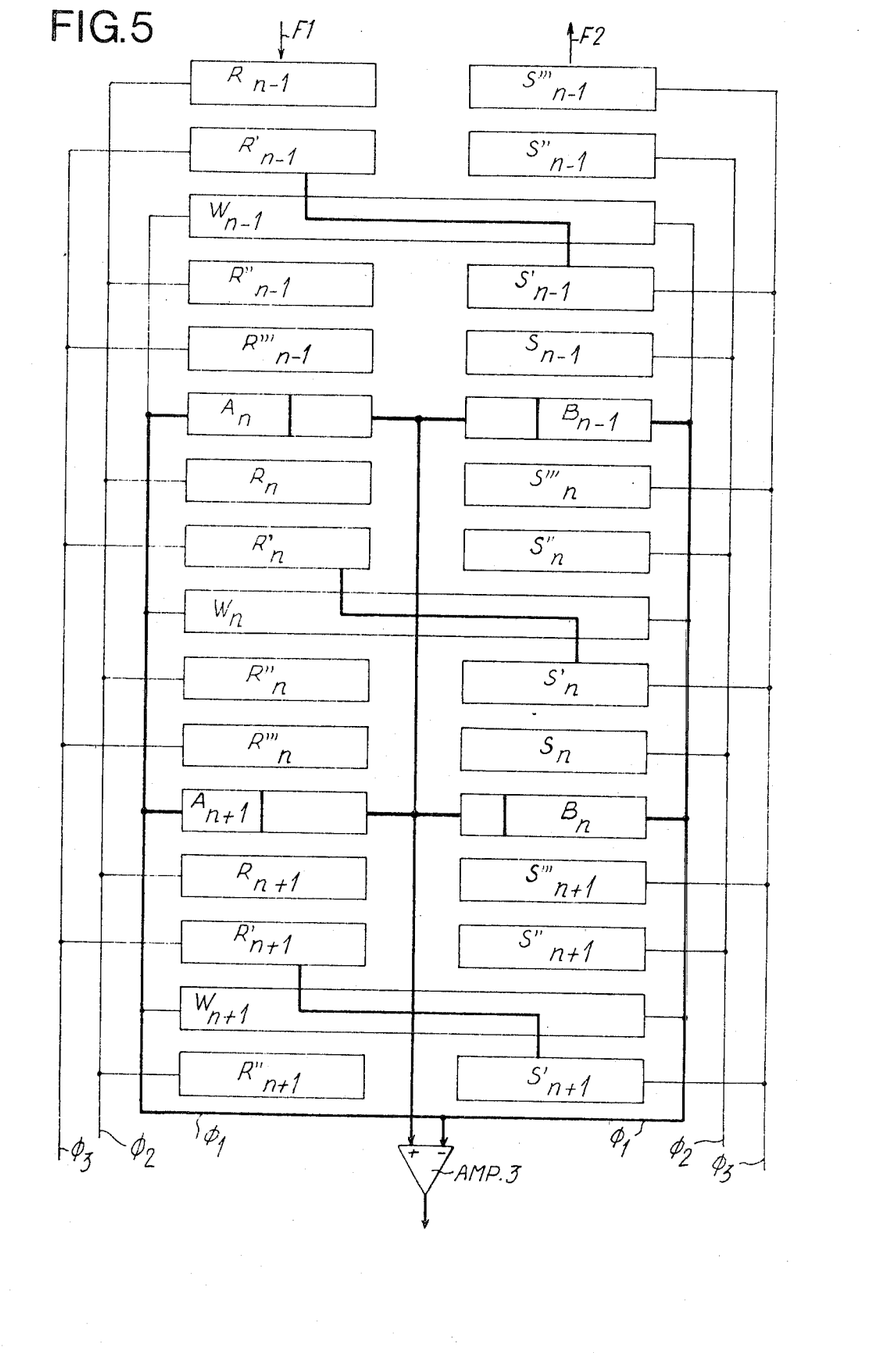
FIG. 5 is a schematic illustration of a further three-phase charge transfer device for a further recursive filter according to the invention.

In the charge transfer device of FIG. 5, a single channel is also provided with three parts. Split electrodes . . . , $A_n, A_{n+1}, \ldots$; and bridge electrodes . . . , $W_{n-1}, W_n, W_{n+1}, \ldots$ are provided in the lower part, with two memory electrodes $R_x$ and $R'_x$ between the electrode $A_n$ and the bridge electrode $W_n$. Two memory electrodes $R''_x$ and $R'''_x$ are positioned between the bridge electrode $W_x$ and the electrode $A_{x+1}$, and so forth. Split electrodes $B_x$ and bridge electrodes $W_x$ are provided in the upper part, with two memory electrodes $S_x$ and $S'_x$ between the electrode $B_x$ and the bridge electrode $W_x$, and with two memory electrodes $S''_x$ and $S'''_x$ between the bridge electrode $W_x$ and the electrode $B_{x-1}$, and so forth.

The electrodes $A_x$, $R_x$, $R'_x$, $R''_x$ and $R'''_x$ extend only in the lower part of the channel. The electrodes $B_x$, $S_x$, $S'_x$, $S''_x$ and $S'''_x$ extend only in the upper part of the channel. The bridge electrodes $W_x$ extend over the entire width of the channel including the middle part. As, in FIG. 4, the electrodes $W_x$ are divided into two sections $W1_x$ and $W2_x$ by barriers $C_x$.

The electrodes $A_x$, $B_x$ and $W_x$ are connected to the phase bus $\phi1$, the electrodes $R_x$, $R'_x$, $S_x$ are connected to the phase bus $\phi2$, and the electrodes $R''_x$, $R'''_x$, $S''_x$ are connected to the phase bus $\phi3$.

The split electrodes $A_x$ and $B_x$ are further divided into parts $A1_x$, $A2_x$ and $B1_x$, $B2_x$, respectively. The electrode parts $A1_x$ and $B1_x$ are connected to the input $-$ of a differential amplifier AMP3, whereas the electrode parts $A2_x$ and $B2_x$ are connected to the input $+$ of the amplifier.

The charges flow in the direction of the arrows F1 and F2, as for the device shown in FIG. 4.

Figure 6:
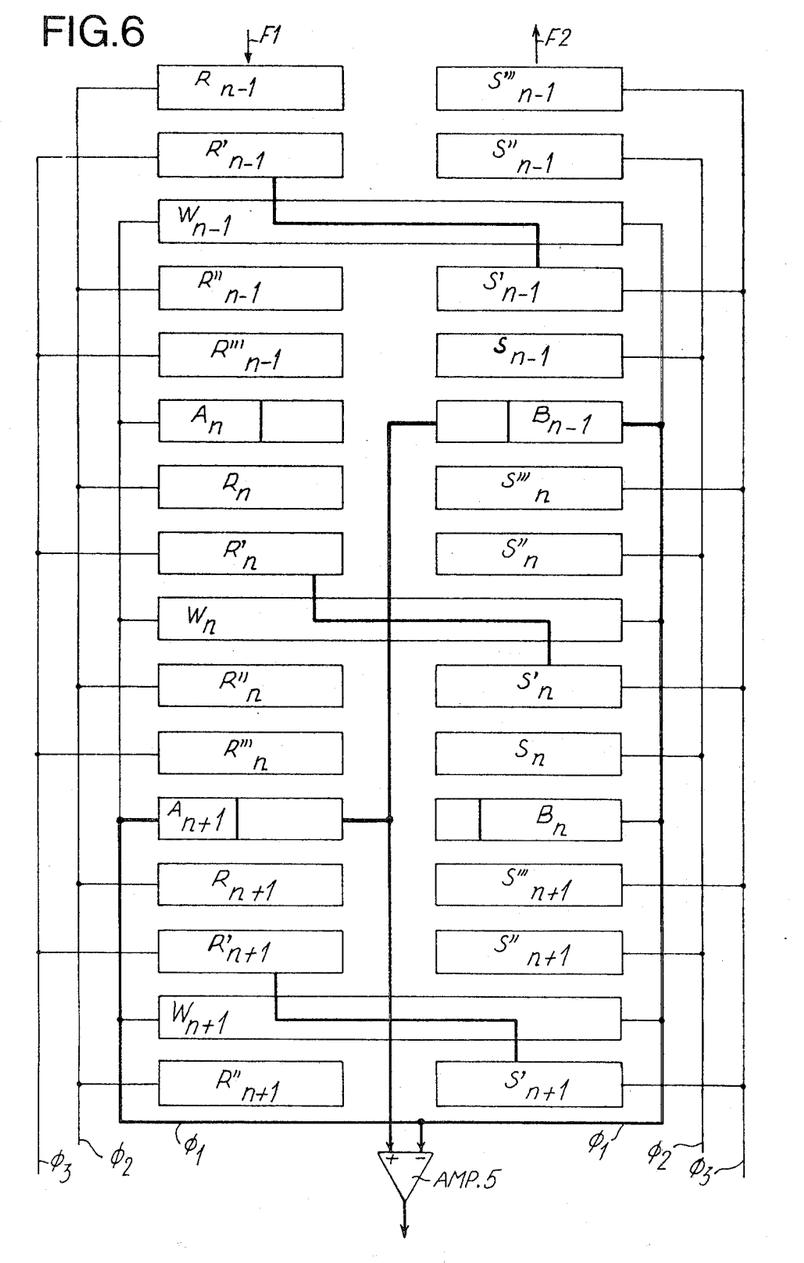
FIG. 6 is a schematic illustration of an alternative embodiment for the filters of the FIGS. 4 and 5.

The electrode implantation in the charge transfer device of FIG. 6 is closely related to the one illustrated in FIG. 5, except that the old order electrodes, which are normally divided, are not divided in this case, say the electrodes $A_{4p+1}$, $A_{4p+3}$, $B_{4p+1}$ and $B_{4p+3}$. Also, the split electrodes are not connected to the inputs of the differential amplifier AMP5 in the same manner. The parts A1 of the split electrodes $A_{4p}$ and the parts B1 of the electrodes $B_{4p}$ are the only parts which are connected to the input $(-)$ of the amplifier AMP5. The parts A1 of the split electrodes $A_{4p+2}$ and the parts B1 of the electrodes $B_{4p+2}$ are the only parts which are connected to the input $+$ of said amplifier. As for the parts A2 and B2 of the electrodes, they are merely connected to the phase bus $\phi1$.

Figure 7:
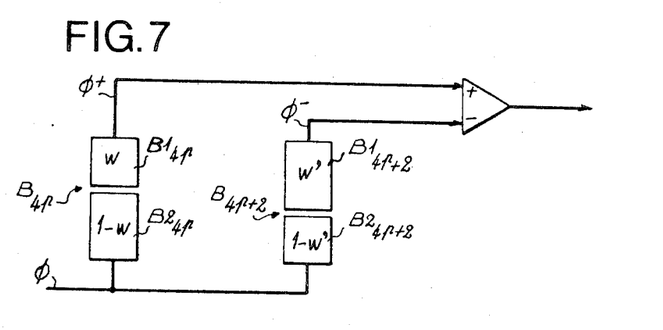
FIG. 7 is a schematic diagram illustrating one aspect of the operation of the filter of FIG. 6.

Two split electrodes $B_{4p}$ and $B_{4p+2}$ are shown in FIG. 7. Their parts $B1_{4p}$ and $B1_{4p+2}$ are respectively connected to the inputs $-$ and $+$ of the amplifier AMP5. The parts B2 of the electrodes are merely connected to the phase bus $\phi1$. If the respective lengths of $B1_{4p}$ and $B2_{4p}$ are equal to w and $(1-w)$, and if the lengths of $B1_{4p+2}$ and $B2_{4p+2}$ are respectively equal to $w'$ and $(1-w')$, the contribution of the parts to the output signal of the amplifier AMP5 will be equal to $(w-w')$. For the same parts, the noise will be proportional to the sum $(w+w')$. Contrary to what appears with the technology utilized up to now, the noise has ceased to be systematically proportional to the total length of a split electrode. However, the two lengths of such an electrode may be chosen in order to minimize the noise while respecting the difference which determines the output signal.

On the other hand and with regard to the interconnections, the dead parts B2 (or A2) of the split electrodes are connected to the same central bus, whereas the bus $\phi1+$ and $\phi1-$ are laying outside and thus in better balance.

Figure 8:
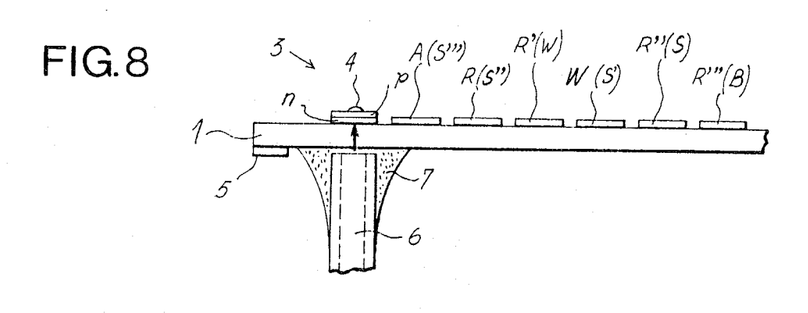
FIGS. 8 and 9 are schematic views illustrating respectively three types of optical input devices which can be particularly utilized with the CTD devices of FIGS. 4, 5 and 6.

An optical input structure for a charge transfer device according to the invention is schematically shown in the cross section shown in FIG. 8. The device comprising a semiconducting layer 1 has at its surface, the electrodes A, R, R', W, R'', R''', . . . (or S''', S'', W, S', S, B, . . . ). In front of the first electrode A, the semiconducting layer supports a p-n Schottky diode 3, a contact 4 being provided on the region p of the diode. Another contact 5 is provided under the adjacent edge of the layer 1. A convenient voltage source is connected between the contacts 4 and 5, the Schottky diode being reversely biased by the voltage source in order to operate as an optical detector.

The emitting end of an optical fiber 6 is placed under the surface of the layer 1, perpendicularly to the layer, in order to illuminate the region n of the diode 3. The semiconducting material of the layer 1 is transparent through the optical fiber. The end of the optical fiber 6 is held in place by a convenient resin block 7 which secures the fiber onto the lower face of the semiconductor.

Figure 9:
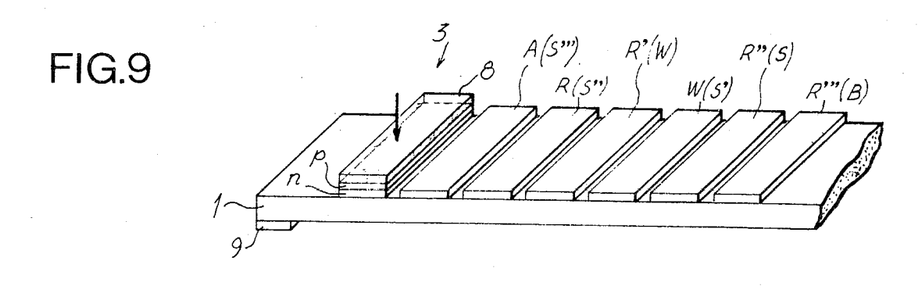

FIG. 9 shows another optical input structure for a charge transfer device according to the invention. The reference numerals used in FIG. 9 for the semiconducting layer, the charge transfer electrodes and the Schottky diode of FIG. 8 are the same as those which have been used for the same components in FIG. 8. In this case, the region p of the diode 3 is provided with a transparent contact conducting electrode 8. A contact 9 is provided under the semiconductor 1, and a convenient voltage source is connected between the components 8 and 9, the diode being reversely biased by the source in order to operate as an optical detector. The light carrying the input signal is applied to the Schottky diode through the transparent electrode 8.

Those who are skilled in the art will readily perceive how to modify the invention. Therefore, the appended claims are to be construed to cover all equivalent structures which fall within the true scope and spirit of the invention.

We claim:

1. A recursive filter having a common channel CTD charge transfer device comprising two delay line means along which charges are transferred in opposite directions, memory means comprising split electrodes coupled into each of said delay lines, said split electrodes forming outer and inner parts, exchange means comprising bridge electrodes extending between the delay lines, the exchange bridge electrodes being divided into two sections with each section enabling predetermined charges to feed from two upstream electrodes to one of two downstream electrodes in the respective delay lines, a gap between each exchange bridge section and an adjacent memory electrode with a transfer electrode in said gap, comprising a three-phase ($\phi 1$, $\phi 2$, $\phi 3$) system means for controlling charge transfer in the CTD device, split electrodes of said memory means and the exchange means being coupled to be energized by the first phase ($\phi 1$), some of the transfer electrodes being coupled to be energized by the second phase ($\phi 2$) and other of the second transfer electrodes being coupled to be energized by the third phase ($\phi 3$), and the gap between an electrode of said memory means and the next downstream exchange means being occupied by a transfer electrode connected to the second phase ($\phi 2$) and by a transfer electrode connected to the third phase ($\phi 3$), a differential amplifier means having two inputs and one output, the outer parts of the electrodes of said memory means being connected to one of said inputs of said differential amplifier, the inner parts of the electrodes of said memory means being connected to the other of said inputs of said differential amplifier, and the output of said recursive filter appearing as a filtered output signal at the output of said differential amplifier.

2. The recursive filter of claim 1, wherein the memory means have other electrodes which are not connected to the differential amplifier, the other electrodes being connected in one of the two delay lines.

3. The recursive filter of claim 2, wherein the outer parts of the memory electrodes which are connected to the differential amplifier are alternatively connected in each of said delay lines, either to said one input terminal or to the other input terminal of said amplifier, the inner parts of said electrodes being connected to a bus carrying a corresponding phase.

4. The recursive filter of anyone of claims 1-3 wherein the CTD device is constructed on a transparent semiconductor substrate, and input structure means comprising a Schottky diode having an $n^-$ region in contact with the substrate, said region extending in parallel with the electrodes of the CTD device in one part of the delay line, and a $p^+$ region having a contact connected to one terminal of said source of potential, the other terminal of said source of potential being connected to a contact under said semiconductor substrate, an optical fiber having an end directed through the transparent semiconductor device to the $n^-$ region of the Schottky diode, and means for transmitting an input signal to be filtered through said optical fiber.

5. The recursive filter of claim 4, and a contact of the $p^+$ region of the Schottky diode being formed by a transparent electrode, the optical fiber being oriented directly toward said electrode.

* * * * *